United States Patent
Higano et al.

(10) Patent No.: US 10,332,649 B2
(45) Date of Patent: Jun. 25, 2019

(54) CONDUCTIVE PASTE

(71) Applicants: MITSUBISHI MATERIALS CORPORATION, Tokyo (JP); Mitsubishi Materials Electronic Chemicals Co., Ltd., Akita-shi (JP)

(72) Inventors: Satoko Higano, Naka-gun (JP); Kazuhiko Yamasaki, Naka-gun (JP); Kensuke Kageyama, Akita (JP); Hirokazu Tsukada, Akita (JP)

(73) Assignees: MITSUBISHI MATERIALS CORPORATION, Tokyo (JP); MITSUBISHI MATERIALS ELECTRONIC CHEMICALS CO., LTD., Akita-ski (JP)

( * ) Notice: Subject to any disclaimer, the term of this patent is extended or adjusted under 35 U.S.C. 154(b) by 0 days.

(21) Appl. No.: 15/129,120

(22) PCT Filed: Mar. 27, 2015

(86) PCT No.: PCT/JP2015/059641
§ 371 (c)(1),
(2) Date: Sep. 26, 2016

(87) PCT Pub. No.: WO2015/147267
PCT Pub. Date: Oct. 1, 2015

(65) Prior Publication Data
US 2017/0103824 A1    Apr. 13, 2017

(30) Foreign Application Priority Data
Mar. 28, 2014    (JP) ................... 2014-067832

(51) Int. Cl.
| | | |
|---|---|---|
| H01B 1/02 | (2006.01) |
| C09D 11/52 | (2014.01) |
| C08L 63/00 | (2006.01) |
| H01B 1/22 | (2006.01) |
| H05K 1/09 | (2006.01) |
| C09D 11/037 | (2014.01) |
| C09D 11/102 | (2014.01) |
| C08K 9/12 | (2006.01) |
| C08K 3/08 | (2006.01) |

(52) U.S. Cl.
CPC ............. *H01B 1/02* (2013.01); *C08L 63/00* (2013.01); *C09D 11/037* (2013.01); *C09D 11/102* (2013.01); *C09D 11/52* (2013.01); *H01B 1/22* (2013.01); *H05K 1/095* (2013.01); *C08K 9/12* (2013.01); *C08K 2003/0806* (2013.01)

(58) Field of Classification Search
CPC ........................................................ H01B 1/02
See application file for complete search history.

(56) References Cited

U.S. PATENT DOCUMENTS

| | | | | |
|---|---|---|---|---|
| 2012/0119156 A1* | 5/2012 | Kamiya | ............... | C08G 59/70 |
| | | | | 252/500 |
| 2014/0178671 A1* | 6/2014 | Dreezen | ............... | C08G 59/184 |
| | | | | 428/323 |

FOREIGN PATENT DOCUMENTS

| | | | |
|---|---|---|---|
| CN | 102015884 | A | 4/2011 |
| CN | 103433502 | A | 12/2013 |
| EP | 1050888 | A1 | 11/2000 |
| EP | 2607520 | A1 | 6/2013 |
| JP | 01-225776 | A | 9/1989 |
| JP | 02-118079 | A | 5/1990 |
| JP | 2006-012709 | A | 1/2006 |
| JP | 2007-179785 | A | 7/2007 |
| JP | 2010-083952 | A | 4/2010 |
| JP | 2010-083953 | A | 4/2010 |
| JP | 2012-038615 | A | 2/2012 |
| JP | 2012-164484 | * | 8/2012 |
| JP | 2012-164484 | A | 8/2012 |
| JP | 5212108 | B | 6/2013 |
| JP | 2013-219389 | A | 10/2013 |

OTHER PUBLICATIONS

Office Action dated Apr. 12, 2017, issued for the Chinese patent application No. 201580016391.9 and English translation thereof.
International Search Report dated May 26, 2015, issued for PCT/JP2015/059641 and English translation thereof.
The Extended European Search Report dated Oct. 11, 2017, issued for the European patent application No. 15770214.3.
He Ying et al., "Section V. Polyolefin-based Coating Resin Chemistry", Coating Resin Chemistry, Chemical Industry Press, Aug. 31, 2007, pp. 280-281 and information sheets. (cited in the Dec. 29, 2017 CN OA).
Tong Zhongliang, "Bd 013 High Molecular Weight Polystyrene Resins", Handbook of Chemical Products: Resins and Plastics, Chemical Industry Press, Aug. 31, 2008, pp. 229 and information sheet. (cited in the Dec. 29, 2017 CN OA).
Office Action dated Dec. 29, 2017, issued for the Chinese patent application No. 201580016391.9.

* cited by examiner

*Primary Examiner* — William D Young
(74) *Attorney, Agent, or Firm* — Locke Lord LLP

(57) ABSTRACT

A conductive paste includes: a silver-coated resin; and an organic vehicle that includes a thermosetting resin composition, a curing agent, and a solvent, in which the thermosetting resin composition is an epoxy resin composition which is solid at room temperature and has a melt viscosity of 0.5 Pa·s or lower at 150° C., and a mass ratio of a content of the thermosetting resin composition to a content of the silver-coated resin is 10 to 40:60 to 90.

6 Claims, No Drawings

CONDUCTIVE PASTE

TECHNICAL FIELD

The present invention relates to a conductive paste. Specifically, the present invention relates to a conductive paste which is used for forming an electrode or an electrical wiring. More specifically, the present invention relates to a conductive paste with which an electrode, an electrical wiring, or the like having high conductivity can be formed at a low cost and in which quality deterioration which occurs over time is very small even after long-term storage.

Priority is claimed on Japanese Patent Application No. 2014-067832, filed Mar. 28, 2014, the content of which is incorporated herein by reference.

BACKGROUND ART

A conductive paste is used for forming an electronic component (for example, an electrode or an electrical wiring) included in a semiconductor element, an electronic apparatus, or an electronic display apparatus, for example, a solar cell panel or a liquid crystal display. In a conductive paste, silver powder is mainly used as a conductive filler, and this conductive paste is prepared in the form of a paste by mixing the conductive filler, a resin as a binder component, and other components such as a solvent with each other. In order to form an electrode or the like using a conductive paste, first, the conductive paste is applied to a surface of a substrate or the like using a coating method such as a screen printing method or an offset printing method to form a printed pattern thereon. Next, the printed pattern formed is dried or fired at a desired temperature to form an electrode or the like. This method of forming an electrode or the like using a conductive paste is preferable from the viewpoint of costs or the like because a large-sized apparatus which is used in, for example, a sputtering method of forming a wiring in a vacuum or the like is not necessary.

On the other hand, even in the technical field of forming an electrode or the like using a conductive paste, there are still many problems and areas to be improved, for example, improvement of conductivity or printing performance. For example, a conductive paste to be used has been studied in various ways, and, for example, various improvements and developments have been made. For example, Patent Document 1 discloses a conductive silver paste including, as essential components: silver particles (A); a resin (B) that is solid at 25° C.; and an organic cyclic ether compound (C) having a flash point of 50° C. to 200° C., in which the amount of the organic cyclic ether compound (C) is 15 to 30 parts by mass with respect to 100 parts by mass of the silver particles (A). With this conductive silver paste, a high-precision conductive pattern can be formed using a gravure offset printing method or the like at a low temperature within a short period of time.

In addition, for example, an active energy ray-curable conductive ink that a chlorinated polyester and an active energy ray-polymerizable compound are used as a binder component has been disclosed (for example, refer to Patent Document 2). In this conductive ink, the binder component includes the chlorinated polyester and the active energy ray-polymerizable compound. Therefore, the conductive ink has satisfactory fluidity and a low-resistance circuit can be formed.

In addition, a conductive ink composition including conductive particles and an organic vehicle which includes a thermosetting resin composition, a curing agent, and a solvent has been disclosed, and this conductive ink composition is prepared by mixing the thermosetting resin composition, which is an epoxy resin composition having specific characteristics, with the conductive particles at a predetermined mass ratio (for example, refer to Patent Document 3). In the conductive ink composition, the epoxy resin composition having specific characteristics is used. As a result, sufficient adhesion is obtained even when the adhesion area is narrow due to thinning, a highly reliable electrode having high heat resistance can be formed, and the conductive ink composition can be sufficiently cured by heating for a short period of time.

CITATION LIST

Patent Document

[Patent Document 1] Japanese Unexamined Patent Application, First Publication No. 2012-38615 (claim 1, claim 8, paragraph [0009])

[Patent Document 2] Japanese Patent No. 5212108 (claim 1, paragraph [0017])

[Patent Document 3] Japanese Unexamined Patent Application, First Publication No. 2010-83952 (claim 1, paragraph [0023])

DISCLOSURE OF INVENTION

Technical Problem

In these technical fields of forming an electrode or the like using a conductive paste, one of the major problems other than the problems disclosed in Patent Documents 1 to 3 is that of stability with time in a prepared paste. When a conductive paste is stored for a long period of time, the quality thereof deteriorates depending on the material or the like thereof. For example, the viscosity of the paste may increase or a component may separate from the paste such that printing performance and conductivity of a formed electrode deteriorate significantly. In order to reduce costs, a conductive paste has been developed in which a silver-coated resin obtained by coating a surface of a spherical resin such as acryl with silver by plating or the like is used as a conductive filler instead of silver powder which has been generally used. In a conductive paste obtained using this silver-coated resin, in particular, a large amount of a catalyst component such as a reducing agent or a complexing agent, which is used for coating the resin surface with silver by electroless plating or the like, remains, which accelerates the curing of the resin component in the paste and thus causes a problem in that, the viscosity of the paste is increased over time.

In order to solve the problem relating to the stability with time of a paste, a method of adding a stabilizer to a paste or a method of mixing raw materials of a paste immediately before using the paste is generally used. However, these methods have problems of, for example, high costs and low initial conductivity. Therefore, as a result of thorough research, the present inventors discovered a new effect in an epoxy resin composition having specific characteristics and succeeded in improving the stability with time of a conductive paste, which is prepared using a silver-coated resin, by selectively using an epoxy resin composition having specific characteristics in the conductive paste.

An object of the present invention is to provide a conductive paste with which an electrode, an electrical wiring, or the like having high conductivity can be formed at a low cost and in which quality deterioration which occurs over time is very small even after long-term storage.

Solution to Problem

According to a first aspect of the present invention, there is provided a conductive paste including: a silver-coated resin; and an organic vehicle which includes a thermosetting resin composition, a curing agent, and a solvent. In this conductive paste, the silver-coated resin is a silver-coated spherical resin having a surface coated with silver, the thermosetting resin composition is an epoxy resin composition which is solid at room temperature and has a melt viscosity of 0.5 Pa·s or lower at 150° C., and a mass ratio of a content of the thermosetting resin composition to a content of the silver-coated resin is 10 to 40:60 to 90.

According to a second aspect of the present invention, in the conductive paste according to the first aspect, the thermosetting resin composition is one epoxy resin composition or two or more epoxy resin compositions selected from the group consisting of a biphenyl type, a biphenyl-containing type, a naphthalene type, a cresol novolac type, and a dicyclopentadiene type.

According to a third aspect of the present invention, in the conductive paste according to the first or second aspect, the curing agent is an imidazole, a tertiary amine, a Lewis acid containing boron fluoride, or a compound thereof.

According to a fourth aspect of the present invention, the conductive paste according to any one of the first to third aspects is heated and cured in a temperature range of 80° C. to 300° C.

According to a fifth aspect of the present invention, there is provided a method of manufacturing a silver film using the conductive paste according to any one of the first to fourth aspects.

Advantageous Effects of Invention

The conductive paste according to the first aspect of the present invention includes: a silver-coated resin; and an organic vehicle which includes a thermosetting resin composition, a curing agent, and a solvent, in which the silver-coated resin is a silver-coated spherical resin having a surface coated with silver, the thermosetting resin composition is an epoxy resin composition which is solid at room temperature and has a melt viscosity of 0.5 Pa·s or lower at 150° C., and a mass ratio of a content of the thermosetting resin composition to a content of the silver-coated resin is 10 to 40:60 to 90. As a result, an electrode, an electrical wiring, or the like having high conductivity can be formed at a low cost. In addition, even after long-term storage, deterioration in, for example, the printing performance of a conductive paste and the conductivity of a formed electrode which occurs over time can be prevented.

In the conductive paste according to the second aspect of the present invention, the thermosetting resin composition is one epoxy resin composition or two or more epoxy resin compositions selected from the group consisting of a biphenyl type, a biphenyl-containing type, a naphthalene type, a cresol novolac type, and a dicyclopentadiene type. Therefore, shape retainability is high, and collapse in shape caused when an electrode is fired after printing can be significantly reduced.

In the conductive paste according to the third aspect of the present invention, the curing agent is an imidazole, a tertiary amine, a Lewis acid containing boron fluoride, or a compound thereof. Therefore, the curability of the conductive paste is improved, and an electrode or the like having strong adhesion to a substrate can be formed.

The conductive paste according to the fourth aspect of the present invention is heated and cured in a temperature range of 80° C. to 300° C. Therefore, even when the conductive paste is fired at a lower temperature, high conductivity can be exhibited. Thus, the selection range of substrates which can be used is very wide.

In the manufacturing method according to the fifth aspect of the present invention, a silver film is formed using the above-described conductive paste, the silver film being used for forming an electronic component (for example, an electrode or an electrical wiring) provided in a semiconductor element, an electronic apparatus, or an electronic display apparatus, in a solar cell panel or a liquid crystal display. As a result, an effect of further improving device performance can be obtained.

BEST MODE FOR CARRYING OUT THE INVENTION

Next, an embodiment of the present invention will be described.

A conductive paste disclosed herein (hereinafter, also referred to as "paste") includes: a silver-coated spherical resin in which a surface of a resin is coated with silver; and an organic vehicle which includes a thermosetting resin composition, a curing agent, and a solvent.

<Silver-Coated Resin>

The silver-coated resin is used as a conductive filler in the paste, and the silver-coated resin is composed of a resin (resin particles) and silver (silver coating layer) covering the resin surface. Before coating the resin surface with silver, a tin adsorption layer may be formed on the resin surface in advance. In the present invention, the silver-coated resin used as the conductive filler is limited to a spherical resin because, in a case where the silver-coated resin is a plate-shaped resin, there is a problem in that it is extremely difficult to perform thin line printing due to an insufficient filling rate. The meaning of "spherical" is not limited to a complete true circle and includes a shape similar to a spherical shape such as an elliptical shape, a shape having a slightly rough surface. In the silver-coated resin, a ratio of the length of a long axis to the length of a short axis (aspect ratio of long axis/short axis) is preferably 0.9 to 1.1 and more preferably 0.95 to 1.05.

From the viewpoint of using the epoxy resin composition having specific characteristics to improve stability with time, the silver-coated resin is not particularly limited as long as it is formed using a wet silver coating method (for example, a silver-coated resin which is formed by coating a resin surface with silver by general electroless plating). However, in consideration of conductivity, printing performance, stability with time in the viscosity of a paste, and the like, the following silver-coated resin is preferably used.

It is preferable that the average particle size of the silver-coated resin be in a range of more than 0.5 μm to 5 μm or less. The reason why it is preferable that the average particle size of the silver-coated resin be in the above-described range is as follows. In a case where the average particle size of the silver-coated resin is less than the lower limit value (that is, 0.5 μm or less), a problem of, for example, aggregation may occur. Therefore, it is difficult to obtain a satisfactory silver-coated resin from the viewpoint of coatability. In addition, in a case where the average particle size of the silver-coated resin is more than the upper limit value, it is difficult to form an electrode, a wiring, or the like having a fine line width. It is more preferable that the average particle size of the silver-coated resin be 1.0 to 3.0 μm. In this specification, the average particle size of the silver-coated resin refers to a number average value which is obtained by observing 300 silver-coated resin particles with a scanning electron microscope (Model Name: SU-1500, manufactured by Hitachi High-Technologies Corporation) at a magnification of 5000 times, measuring diameters thereof by software (product name: PC SEM), and calculating the average thereof. In a case where resin particles have a shape other than a spherical shape, the average particle size refers to an average length of long axis thereof.

In addition, it is preferable that the specific gravity of the silver-coated resin be in a range of 2.0 to 5.0. The reason why it is preferable that the specific gravity of the silver-coated resin be in the above-described range is as follows. In a case where the specific gravity of the silver-coated resin is lower than the lower limit value, the resistance value is likely to increase, and it is difficult to form an electrode, a wiring, or the like having high conductivity. In addition, in a case where the specific gravity of the silver-coated resin is higher than the upper limit value, a paste having satisfactory fluidity cannot be obtained, a problem in printing performance or the like, for example, blurring during printing may occur, and it may be difficult to form an electrode, a wiring, or the like having high quality. In addition, since the amount of silver used increases, the production costs increase. It is more preferable that the specific gravity of the silver-coated resin be in a range of 2.5 to 4.5. The specific gravity of silver is generally about 10.49.

From the viewpoints of chemical resistance and heat resistance, it is preferable that a resin material constituting the silver-coated resin having a surface coated with silver be one resin or two or more resins selected from the group of acryl, phenol, polystyrene, silicone, polyamide, and polytetrafluoroethylene (PTFE).

As the resin constituting the silver-coated resin, a spherical resin having an average particle size of 0.5 μm or more and less than 5 μm is preferably used. The reason for this is, for example, to form the silver-coated resin in a spherical shape as described above and to obtain the silver-coated resin having the desired specific gravity and average particle size. The spherical shape is not limited to a complete true circle. In addition, the average particle size of the spherical resin refers to a number average value which is obtained by observing 300 resin particles with the above-described scanning electron microscope at a magnification of 5000 times, measuring diameters thereof by software (product name: PC SEM), and calculating the average thereof. Further, in a case where a spherical resin is used, the coefficient variation of the particle size of the spherical resin is preferably 7% or lower and more preferably 5% or lower, and it is preferable that the spherical resin have a uniform particle size. The coefficient variation (CV value; unit: %) refers to a value which is obtained from the particle sizes of the 300 spherical resin particles according to the expression: "(Standard Deviation/Average Particle Size)×100".

Before coating the resin surface with silver, a tin adsorption layer may be provided on the resin surface by a pre-treatment described below. In general, when electroless plating is performed on a surface of a non-conductor such as an organic material or an inorganic material, it is necessary to catalyze the surface of the non-conductor in advance. By catalyzing the resin surface and then providing a tin adsorption layer on the resin surface as a pre-treatment, silver (silver coating layer) having characteristics described below is formed by electroless plating described below. The tin adsorption layer is obtained when divalent tin ions in a tin compound used in the pre-treatment are adsorbed on the resin surface.

The silver constituting the silver-coated resin is formed by coating the resin surface with silver by electroless plating, and the crystallite diameter thereof measured using an X-ray diffraction method is preferably in a range of 18 to 24 nm. In a case where the crystallite diameter of silver is less than 18 nm, crystal grains of silver are likely to aggregate, it is difficult to obtain a dense silver coating film, and adhesion between the resin and silver tends to deteriorate. In a case where the crystallite diameter of silver is more than 24 nm, crystal grains of silver are likely to be coarse, it is difficult to obtain a dense silver coating film, and adhesion between the resin and silver tends to deteriorate. The crystallite diameter of silver described herein refers to the average value of crystallite diameters of (111) plane, (200) plane, (220) plane, and (311) plane which are obtained with a Debye-Scherrer method of X-ray diffraction using CuK α rays.

The silver-coated resin can be manufactured using the following method. First, the pre-treatment is performed on the resin using a aqueous solution containing a tin compound (a step of forming a tin adsorption layer), and then electroless silver plating is performed on the resin having undergone the pre-treatment using a reducing agent (a step of forming a silver coating layer).

In the pre-treatment, for example, the resin is added to the aqueous solution containing a tin compound, and the components are stirred. The spherical resin is separated by filtration and is washed with water. The stirring time is appropriately determined based on the temperature of the aqueous solution containing a tin compound and the content of the tin compound and is preferably 0.5 to 24 hours.

The temperature of the aqueous solution containing a tin compound is 20° C. to 45° C., preferably 20° C. to 35° C., more preferably 25° C. to 35° C., and most preferably 27° C. to 35° C. In a case where the temperature of the aqueous solution containing a tin compound is lower than 20° C., the activity of the aqueous solution decreases due to a decrease in the temperature, and the tin compound is not sufficiently adsorbed on the resin. On the other hand, in a case where the temperature of the aqueous solution containing a tin compound is higher than 45° C., the tin compound is oxidized. Therefore, the aqueous solution is unstable, and the tin compound is not sufficiently adsorbed on the resin. By performing the pre-treatment in the aqueous solution at 20° C. to 45° C., silver crystal grains having an appropriate crystallite diameter can be deposited. Therefore, a silver plating layer (silver coating layer) having satisfactory adhesion and denseness can be formed. Examples of the tin compound used in the pre-treatment include stannous chloride, stannous fluoride, stannous bromide, and stannous iodide. In a case where stannous chloride is used, the content of stannous chloride in the aqueous solution containing a tin compound is preferably 30 $g/dm^3$ to 100 $g/dm^3$. In a case where the content of stannous chloride is 30 $g/dm^3$ or higher, a uniform tin adsorption layer is likely to be formed. In addition, in a case where the content of stannous chloride is 100 $g/dm^3$ or lower, the amount of inevitable impurities in stannous chloride is likely to be reduced. Stannous chloride can be added to the aqueous solution containing a tin compound until it is saturated.

It is preferable that the aqueous solution containing a tin compound contain 0.5 $cm^3$ to 2 $cm^3$ of hydrochloric acid with respect to 1 g of stannous chloride. In a case where the amount of hydrochloric acid is 0.5 $cm^3$ or more, the solubility of stannous chloride is improved, and the hydrolysis of tin can be prevented. In a case where the amount of hydrochloric acid is 2 cm$^3$ or less, the pH of the aqueous solution containing a tin compound is not excessively low, and tin can be efficiently adsorbed on the resin.

Examples of an electroless plating method include: (1) a method of dipping the resin having undergone the pre-treatment in an aqueous solution containing a complexing agent, a reducing agent, and the like, and adding an aqueous silver salt solution thereto dropwise; (2) a method of dipping the resin having undergone the pre-treatment in an aqueous solution containing a silver salt and a complexing agent, and adding an aqueous reducing agent solution thereto dropwise; and (3) a method of dipping the resin having undergone the pre-treatment in an aqueous solution containing a silver salt, a complexing agent, a reducing agent, and the like, and adding an aqueous caustic alkali solution thereto dropwise. Among these, any method may be applied. As the silver salt, for example, silver nitrate or a solution in which or silver is dissolved in nitric acid can be used. Examples of the complexing agent include salts of ammonia, ethylenediaminetetraacetic acid, tetrasodium ethylenediaminetetraacetic acid, nitrotriacetic acid, and triethylenetetraminehexaacetic acid. From the viewpoint of using the epoxy resin composition having specific characteristics to improve stability with time, for example, ammonia, ethylenediaminetetraacetic acid, or triethylenetetraminehexaacetic acid is most effective as the complexing agent. Examples of the reducing agent include formaldehyde, glucose, Rochelle salt (potassium sodium tartrate), hydrazine, and derivatives thereof. As the reducing agent, from the viewpoint of strong reducing power, formaldehyde is preferable, a mixture of two or more reducing agents including at least formaldehyde is more preferable, and a mixture of reducing agents including formaldehyde and glucose is most preferable. The aqueous caustic alkali solution is not particularly limited. For example, an aqueous solution containing 5 mass % to 20 mass % of sodium hydroxide or potassium hydroxide can be used.

It is preferable that the proportion of the conductive filler included in the conductive paste, that is, the silver-coated resin be 70 mass % to 90 mass % with respect to the 100 mass % of the paste. In a case where the proportion of the silver-coated resin in the paste is lower than the lower limit value, the resistance value increases (that is, the volume resistivity increases, and conductivity decreases), and it is difficult to form an electrode, a wiring, or the like having high conductivity. On the other hand, in a case where the proportion of the silver-coated resin is higher than the upper limit value, a paste having satisfactory fluidity is not likely to be obtained, and it is difficult to form an electrode, a wiring, or the like which is desirable from the viewpoint of printing performance or the like. It is more preferable that the proportion of the silver-coated resin in the conductive paste be 75 mass % to 85 mass %.

<Organic Vehicle>

The organic vehicle, which is a component included in the conductive paste other than the silver-coated resin, may include a general curing agent, a general solvent, and the like other than the resin component. The thermosetting resin composition included in the conductive paste as a resin component is an epoxy resin composition which is solid at room temperature and has a melt viscosity of 0.5 Pa·s or lower at 150° C. The technical reason why the stability with time of the conductive paste in which the silver-coated resin is used as the conductive filler can be improved by using the epoxy resin composition having the above-described specific characteristics is currently not clear, but is presumed to be that a small amount of the material used for manufacturing the silver-coated resin, for example, a complexing agent or a reducing agent remains and reacts with the epoxy resin composition.

The lower limit value of the melt viscosity at 150° C. of the thermosetting resin composition, which is solid at room temperature, is not particularly limited and may be set as 0.01 Pa·s and more preferably in a range of 0.01 Pa·s to 0.4 Pa·s. In addition, "room temperature" described herein refers to 20° C.

Examples of the epoxy resin composition having the above-described characteristics include epoxy resins of a biphenyl type, a biphenyl-containing type, a naphthalene type, a cresol novolac type, and a dicyclopentadiene type. Examples of the biphenyl type epoxy resin and the biphenyl-containing type epoxy resin include: NC3100, NC3000, NC3000L, CER-1020, and CER-3000L (all of which manufactured by Nippon Kayaku Co., Ltd.); and X4000, YX4000H, and YL6121H (all of which are manufactured by Mitsubishi Chemical Corporation). In addition, examples of the cresol novolac type epoxy resin include N-665-EXP-S (manufactured by DIC Corporation). In addition, examples of the naphthalene type epoxy resin include HP4032 (manufactured by DTC Corporation). Further, examples of the dicyclopentadiene type epoxy resin include HP7200L and HP7200 (manufactured by DIC Corporation). Among these epoxy resins, two or more kinds may be used in combination. The melt viscosity value described herein refers to a value which is measured using an ICI cone and plate viscometer (manufactured by Research Equipment London Ltd.).

The reason for limiting the resin component to the epoxy resin composition having the above-described specific characteristics except for the stability with time of the paste is, for example, as follows. In general, in a case where an electrode or the like is formed using a conductive paste, the printing or the like of the paste is performed at room temperature. In this time, it is preferable that the viscosity of the paste be in a desirable range. However, in a case where a resin which is liquid at room temperature, for example, some of bisphenol A type or some of bisphenol F type epoxy resin composition is used, the viscosity of the paste is low, a high-precision printed pattern cannot be formed, and there may be a problem in that, for example, short-circuiting occurs due to bonding of adjacent wirings. In addition, in a case where an electrode or the like is formed using a conductive paste, it is important to heat a formed printed pattern to a given temperature to exhibit conductivity. Thus, it is preferable that the viscosity during melting be low. In a case where the melt viscosity is high, sintering between conductive filler particles is inhibited, and there may be a problem in that sufficient conductivity cannot be exhibited. In addition, in a case where a resin composition which is liquid at room temperature as described above is used, the viscosity of an electrode pattern during heating is low due to a low glass transition point, which causes sagging. As a result, it is difficult to maintain a high-precision pattern shape. On the other hand, in a case where a crystalline epoxy resin such as the above-described biphenyl type or biphenyl-containing type epoxy resin composition is used, the crystalline epoxy resin is solid at room temperature, and thus the state of the crystalline epoxy resin can be rapidly converted from liquid to solid by heating due to its crystal structure. That is, the crystalline epoxy resin is stable and solid in the crystal state and, once the temperature reaches the melting point, is rapidly converted from the crystalline state into a liquid state having an extremely low viscosity. By using these characteristics, a high-precision pattern shape can be maintained, and sufficient conductivity can be exhibited.

In addition, the biphenyl type epoxy resin has a rigid structure in which a main chain is not flexible and thus has high crystallinity. The biphenyl type epoxy resin has a highly crystalline structure due to its biphenyl skeleton having high symmetry and is solid at room temperature. Further, the biphenyl type epoxy resin is characterized in that a cured product having high heat resistance can be obtained although it is bifunctional. Therefore, while maintaining a crosslinking density to be low, heat resistance can be improved due to its rigid skeleton. Thus, there are no adverse effects such as brittleness of a cured product or deterioration in moisture resistance, and a cured product having low internal stress can be obtained. Therefore, there is an advantageous effect in that a problem such as cracking is not likely to occur.

In addition, the epoxy resin compositions of the naphthalene type, the cresol novolac type, and the dicyclopentadiene type, which are polyfunctional epoxy resins, are not converted into liquid as rapidly as the biphenyl type epoxy resin but are solid at room temperature due to its characteristic functional group and molecular weight. In addition, regarding the o-cresol novolac type epoxy resin composition (ECN), the dicyclopentadiene type epoxy resin composition, and the naphthalene type epoxy resin composition which are solid at room temperature by introducing a bulky group having a large steric hindrance or a group having a rigid structure into a main skeleton of the epoxy resin, the molecular motion of the epoxy resin is reduced, and the solid state can be maintained at room temperature even when the molecular weight of the epoxy resin is low. In addition, in an epoxy resin having a polycyclic aromatic group such as the naphthalene type epoxy resin composition, due to its rigid and highly hydrophobic structure, heat resistance and moisture resistance are improved, thermal stability of a cured product is high, and flame retardance is high.

As described above, in these epoxy resin compositions, quality deterioration of the paste which occurs over time can be reduced. In addition, an epoxy main chain has a rigid skeleton, a cured product has high heat resistance and moisture resistance. Therefore, the epoxy resin compositions are advantageous in that the durability of a formed electrode or the like can be improved.

The paste includes the thermosetting resin composition, that is, the epoxy resin composition having the above-described specific characteristics such that the mass ratio of the thermosetting resin composition to the silver-coated spherical resin is 10 to 40:60 to 90 (thermosetting resin composition (epoxy resin composition):silver-coated spherical resin). In a case where the ratio of the epoxy resin composition is lower than the lower limit value, a problem such as insufficient adhesion occurs. In a case where the ratio of the epoxy resin composition is higher than the upper limit value, a problem such as a decrease in conductivity occurs. It is more preferable that paste include the thermosetting resin composition at a ratio of 20 to 30:70 to 85 (thermosetting resin composition (epoxy resin composition):silver-coated spherical resin).

It is preferable that the curing agent be an imidazole, a tertiary amine, a Lewis acid containing boron fluoride, or a compound thereof generally used. In addition, as the curing agent, a combination of one or more kinds of the imidazole, the Lewis acid, and the combination thereof may be used.

Examples of the imidazole include 2-methylimidazole, 2-ethyl-4-methylimidazole, 2-phenylimidazole, 2-phenyl-4-methylimidazole, 2-phenyl-4,5-dihydroxymethylimidazole, 2-phenyl-4-methyl-5-hydroxymethylimidazole, and 2-phenylimidazole isocyanuric acid adduct. Examples of the tertiary amine include piperidine, benzyldiamine, diethylaminopropylamine, isophoronediamine, and diaminophenylmethane. Examples of the Lewis acid containing boron fluoride include a boron fluoride-amine complex such as boron fluoride monoethylamine. In addition, a highly latent curing agent such as dicyandiamide (DICY) may be used in combination with the above-described curing agent as an accelerator thereof. Examples of the compound include 2,4-diamino-6-(2'-methylimidazolyl-(1')) ethyl-s-triazine isocyanuric acid adduct, and 2,4-diamino-6-(2'-ethyl-4'-methylimidazolyl-(1')) ethyl-s-triazine. Among these, from the viewpoint of improving adhesion, 2-ethyl-4-methylimidazole or 2-phenyl-4,5-dihydroxymethylimidazole which is an imidazole is more preferable.

Examples of the solvent include dioxane, hexane, toluene, methyl cellosolve, cyclohexane, diethylene glycol dimethyl ether, dimethylformamide, N-methylpyrrolidone, diacetone alcohol, dimethylacetamide, γ-butyrolactone, butyl carbitol, butyl carbitol acetate, ethyl carbitol, ethyl carbitol acetate, butyl cellosolve, butyl cellosolve acetate, ethyl cellosolve, and α-terpineol. Among these, ethyl carbitol acetate, butyl carbitol acetate, or α-terpineol is more preferable.

In a method of preparing the conductive paste, first, the epoxy resin composition is mixed with the solvent at a temperature of preferably 50° C. to 70° C. and more preferably 60° C. In this time, the proportion of the epoxy resin composition is preferably 5 to 50 parts by mass and more preferably 20 to 40 parts by mass with respect to 100 parts by mass of the solvent. Next, an appropriate amount of the curing agent is added (for example, 0.25 to 15 parts by mass with respect to 100 parts by mass of the solvent), and the silver-coated resin is further added. Then, for example, using a mixer such as a triple roll mill, the components are kneaded for preferably 0.1 to 1 hour to obtain a paste. As a result, a conductive paste is prepared. In order to impart an appropriate viscosity and required fluidity to the prepared conductive ink composition and for the above-described reasons, the components are mixed with each other such that the proportion of the conductive filler in the paste is 70 to 90 mass %. For the above-described reasons, the amount of the epoxy resin composition used is adjusted such that the mass ratio of the epoxy resin composition to the silver-coated resin is in the above-described range. The viscosity of the prepared conductive paste is adjusted to be preferably 10 to 300 Pa·s. By adjusting the viscosity to be in the above-described range, printing performance is improved, and a printed pattern shape is satisfactorily maintained after printing.

The conductive paste prepared as described above is used for forming a silver film, the silver film being used for forming an electronic component (for example, an electrode or an electrical wiring) provided in a semiconductor element, an electronic apparatus, or an electronic display apparatus, such as a solar cell panel or a liquid crystal display. In order to form an electrode, a wiring, or the like, first, the conductive paste is applied using, preferably, a coating method such as screen printing to form a desired printed pattern. Next, the conductive paste is dried and fired at a desired temperature. As a result, an electrode, a wiring, or the like is formed. The firing is performed by keeping the conductive paste at a temperature of preferably 80° C. to 300° C. and more preferably 150° C. to 250° C. for 0.5 to 1 hour using an apparatus such as a circulating hot air oven.

Here, the firing temperature refers to a temperature at which the conductive paste is heated and cured.

EXAMPLES

Next, examples of the present invention and comparative examples will be described in detail.

Example 1

First, 20 g of stannous chloride and 20 cm³ of hydrochloric acid having a concentration of 35% were diluted with water to 1 dm³ using a measuring flask having a volume of 1 dm³, and were kept at 25° C. 50 g of an acrylic resin having an average particle size of 2 μm and a coefficient variation of particle size of 2% was added to this aqueous solution, the components were stirred for 5 hours. Next, the acrylic resin was separated by filtration and washed with water. As a result, a pre-treatment was performed.

Next, in order to form a silver coating layer on the acrylic resin having a surface on which the tin coating layer was formed through the pre-treatment by electroless plating, 450 g of tetrasodium ethylenediaminetetraacetic acid (complexing agent), 172 g of sodium hydroxide, and 168 cm³ of formalin (reducing agent) having a concentration of 37% were dissolved in 2 dm³ of water to prepare an aqueous solution containing the complexing agent and the reducing agent. In addition, 183 g of silver nitrate, 183 cm³ of ammonia water having a concentration of 25%, and 366 cm³ of water were mixed with each other to prepare an aqueous solution containing silver nitrate.

Next, the acrylic resin having undergone the pre-treatment was dipped in the aqueous solution containing the complexing agent and the reducing agent prepared as described above. Next, the aqueous solution containing silver nitrate was added dropwise while stirring the aqueous solution containing the complexing agent and the reducing agent. As a result, a silver-coated spherical resin shown in Table 1 below was obtained. The silver-coated resin was washed with water and dried. In the obtained silver-coated resin, the aspect ratio was 1.01, and the specific gravity was 3.0.

Next, a conductive paste was prepared by using the silver-coated spherical resin as a conductive filler at a predetermined ratio. Specifically, first, in addition to the conductive filler, regarding materials constituting an organic vehicle, a biphenyl type epoxy resin composition (product name: NC3100, manufactured by Nippon Kayaku Co., Ltd.), which has a melt viscosity of 0.01 Pa·s at 150° C. and is solid at room temperature, was prepared as a thermosetting resin, an imidazole curing agent 2-ethyl-4-methylimidazole was prepared as a curing agent, and butyl carbitol acetate was prepared as a solvent.

Next, at a temperature of 60° C., 30 parts by mass of the thermosetting resin was mixed with 100 parts by mass of the prepared solvent. Further, an appropriate amount of a curing agent was added to this mixture. The conductive filler was added to the mixture, to which the curing agent was added, such that the proportion of the conductive filler in the prepared paste was 80 mass % and such that the mass ratio of the thermosetting resin to the conductive filler was as shown in Table 1 below. Then, the components were kneaded using a triple roll mill to obtain a paste. As a result, a conductive paste was prepared.

Example 2

A conductive paste was prepared using the same method as in Example 1, except that: the addition amounts of the respective components were adjusted such that the proportion of the conductive filler in the prepared paste was 80 mass % and such that the mass ratio of the thermosetting resin to the conductive filler was as shown in Table 1 below; and a cresol novolac type epoxy resin composition (product name: N-665-EXP-S, manufactured by DIC Corporation), which has a melt viscosity of 0.05 Pa·s at 150° C. and is solid at room temperature, was used as the thermosetting resin.

Example 3

A conductive paste was prepared using the same method as in Example 1, except that: the addition amounts of the respective components were adjusted such that the proportion of the conductive filler in the prepared paste was 75 mass % and such that the mass ratio of the thermosetting resin to the conductive filler was as shown in Table 1 below; and a biphenyl type epoxy resin composition (product name: NC3000, manufactured by Nippon Kayaku Co., Ltd.), which has a melt viscosity of 0.01 Pa·s at 150° C. and is solid at room temperature, was used as the thermosetting resin.

Example 4

A conductive paste was prepared using the same method as in Example 1, except that: the addition amounts of the respective components were adjusted such that the proportion of the conductive filler in the prepared paste was 75 mass % and such that the mass ratio of the thermosetting resin to the conductive filler was as shown in Table 1 below; and a biphenyl-containing type epoxy resin composition (product name: CER-1020, manufactured by Nippon Kayaku Co., Ltd.), which has a melt viscosity of 0.04 Pa·s at 150° C. and is solid at room temperature, was used as the thermosetting resin.

Example 5

A conductive paste was prepared using the same method as in Example 1, except that: the addition amounts of the respective components were adjusted such that the proportion of the conductive filler in the prepared paste was 70 mass % and such that the mass ratio of the thermosetting resin to the conductive filler was as shown in Table 1 below; and a naphthalene type epoxy resin composition (product name: HP4032, manufactured by DIC Corporation), which has a melt viscosity of 0.11 Pa·s at 150° C. and is solid at room temperature, was used as the thermosetting resin.

Example 6

A conductive paste was prepared using the same method as in Example 1, except that: the addition amounts of the respective components were adjusted such that the proportion of the conductive filler in the prepared paste was 80 mass % and such that the mass ratio of the thermosetting resin to the conductive filler was as shown in Table 1 below; and a biphenyl type epoxy resin composition (product name: YX4000, manufactured by Mitsubishi Chemical Corporation), which has a melt viscosity of 0.02 Pa·s at 150° C. and is solid at room temperature, was used as the thermosetting resin.

Comparative Example 1

A conductive paste was prepared using the same method as in Example 1, except that, as shown in Table 1 below, a phenol novolac type epoxy resin composition (product name: N-775, manufactured by DIC Corporation), which has a melt viscosity of 7.5 Pa·s at 150° C. and is solid at room temperature, was used instead of the thermosetting resin composition used in Example 1.

Comparative Example 2

A conductive paste was prepared using the same method as in Example 1, except that, as shown in Table 1 below, silver particles having an average particle size of 2.0 μm were used as the conductive filler instead of the silver-coated spherical resin.

Comparative Example 3

A conductive paste was prepared using the same method as in Example 1, except that: as shown in Table 1 below, silver particles having an average particle size of 2.0 μm were used as the conductive filler instead of the silver-coated spherical resin; and as shown in Table 1 below, a bisphenol A type epoxy resin composition (product name: 1007, manufactured by Mitsubishi Chemical Corporation), which has a melt viscosity of 6.0 Pa·s at 150° C. and is solid at room temperature, was used instead of the thermosetting resin composition used in Example 1.

Comparative Example 4

A conductive paste was prepared using the same method as in Example 1, except that, as shown in Table 1 below, a bisphenol F type epoxy resin composition (product name: 807, manufactured by Mitsubishi Chemical Corporation), which is liquid at room temperature and has a melt viscosity of 4 Pa·s at 25° C., was used instead of the thermosetting resin composition used in Example 1. Since this epoxy resin composition is liquid at room temperature, the melt viscosity at 150° C. is not shown in Table 1.

TABLE 1

|  | Conductive Filler | | Resin Composition | | | |
| --- | --- | --- | --- | --- | --- | --- |
|  | Ratio (Mass Ratio) | Kind | Kind | State at Room Temperature | Melt Viscosity (Pa · s/150° C.) | Ratio (Mass Ratio) |
| Example 1 | 80 | Silver-Coated Resin | Epoxy Resin (Biphenyl Type) | Solid | 0.01 | 25 |
| Example 2 | 75 | Silver-Coated Resin | Epoxy Resin (Cresol Novolac Type) | Solid | 0.05 | 30 |
| Example 3 | 85 | Silver-Coated Resin | Epoxy Resin (Biphenyl Type) | Solid | 0.01 | 22 |
| Example 4 | 80 | Silver-Coated Resin | Epoxy Resin (Biphenyl Type) | Solid | 0.04 | 25 |
| Example 5 | 83 | Silver-Coated Resin | Epoxy Resin (Naphthalene Type) | Solid | 0.11 | 20 |
| Example 6 | 78 | Silver-Coated Resin | Epoxy Resin (Biphenyl Type) | Solid | 0.02 | 20 |
| Comparative Example 1 | 80 | Silver-Coated Resin | Epoxy Resin (Phenol Novolac Type) | Solid | 7.5 | 25 |
| Comparative Example 2 | 80 | Ag Particles | Epoxy Resin (Biphenyl Type) | Solid | 0.01 | 25 |
| Comparative Example 3 | 80 | Ag Particles | Epoxy Resin (Bisphenol A Type) | Solid | 6.0 | 25 |
| Comparative Example 4 | 80 | Silver-Coated Resin | Epoxy Resin (Bisphenol F Type) | Liquid | — | 25 |

<Comparative Test and Evaluation>

Regarding the conductive paste prepared in each of Examples 1 to 6 and Comparative Examples 1 to 4, the viscosity and the screen printing performance were evaluated using the following method. In addition, an electrode was formed using the conductive paste prepared in each of Examples 1 to 6 and Comparative Examples 1 to 4, and the conductivity (specific resistance) thereof was evaluated. These results are shown in Table 2 below. "Immediately After Preparation" represents within 24 hours after preparation.

(i) Viscosity: In a rheometer DHR-3 (manufactured by TA Instruments), using a stainless steel plate having a diameter of 40 mm, a value (shear viscosity) at a shear rate of 0.1 $S^{-1}$ to 1000 $S^{-1}$ was measured. Mainly regarding the paste immediately after preparation, a value at a shear rate of 1 $S^{-1}$ and a value at a shear rate of 100 $S^{-1}$ were compared to each other.

The stability with time of the paste such as an increase in viscosity after long-term storage or a decrease in viscosity caused by paste separation is evaluated as follows. Regarding each of a paste A immediately after preparation and a paste B which was stored in a closed container after preparation under conditions of temperature: 25° C. and relative humidity: 50% for 3 months, a viscosity at a shear rate of 1 $S^{-1}$ or a viscosity at a shear rate of 100 $S^{-1}$ was measured. Based on the measured values, the stability with time of the paste was evaluated. Table 2 shows a change rate of the viscosity of the paste at a shear rate of 100 $S^{-1}$ calculated from the following expression (1) as an index indicating the stability with time of the viscosity of the paste.

Change Rate of Viscosity (%)={(Viscosity of Paste $B$/Viscosity of Paste $A$)−1}×100    (1)

(ii) Screen printing performance: Patterns which were printed on a substrate having a size of 100×100 mm using a screen printing method were evaluated based on the following criteria: a case where disconnection, bleeding, blurring, or the like did not occur in all of ten printed thin patterns was evaluated as "A", a case where thin patterns could be formed without disconnection and where bleeding, blurring, or the like occurred in one or two patterns among the ten patterns was evaluated as "B"; a case where thin patterns could be formed without disconnection and where bleeding, blurring, or the like occurred in three or four patterns among the ten patterns was evaluated as "C"; and a case where no patterns could be formed during printing due to rheological characteristics, where sagging or disconnection occurs in a thin pattern, or where severe bleeding or blurring occurred in five or more patterns among the ten patterns was evaluated as "D".

The printing performance varies depending on the viscosity and was evaluated using a paste immediately after preparation and a paste which was stored in a closed container after preparation under conditions of temperature: 25° C. and relative humidity: 50% for 3 months.

(iii) Conductivity (specific resistance): Immediately after preparation, a conductive paste was applied to a substrate having a size of 100 mm×100 mm using a screen printing method, and this substrate was put into a circulating hot air oven and was fired at a temperature of 200° C. for 30 minutes. Using this conductive paste, an electrode A was formed. Regarding this electrode A, a surface resistivity was measured using a four-point probe surface resistivity meter (LORESTA, manufactured by Mitsubishi Chemical Corporation), and the thickness was measured using a laser microscope (VK-X200, manufactured by Keyence Corporation). Based on these values, a volume resistivity (specific resistance value) of the electrode A was calculated.

In addition, after preparation, a conductive paste was stored in a closed container under conditions of temperature: 25° C. and relative humidity: 50% for 3 months. Using this conductive paste, an electrode B was formed. A volume resistivity of the electrode B was calculated using the above-described method. Based on the calculated values of the electrode A and B, the stability with time of the paste relating to the conductivity was evaluated. Table 2 shows a change rate of the volume resistivity calculated from the following expression (2) as an index indicating the evaluation of stability with time. In Table 2, "-" represents a case where, due to a significant change in the viscosity of the paste after storage, a sample for evaluation could not be printed and the evaluation itself was difficult to perform.

Change Rate (%) of Volume Resistivity={(Volume Resistivity of Electrode $B$/Volume Resistivity of Electrode $A$)−1}×100    (2)

TABLE 2

| | Viscosity | | | | | Printing Performance | | Volume Resistivity Change Rate (%) |
| | 1 $S^{-1}$ (Pa · s) | | 100 $S^{-1}$ (Pa · s) | | | | | |
| | Immediately After Preparation | After Long-Term Storage | Immediately After Preparation | After Long-Term Storage | Change Rate (%) | Immediately After Preparation | After Long-Term Storage | |
|---|---|---|---|---|---|---|---|---|
| Example 1 | 930 | 950 | 80 | 83 | 3.8 | B | B | 4 |
| Example 2 | 890 | 910 | 65 | 69 | 6.1 | B | B | 12 |
| Example 3 | 510 | 630 | 70 | 71 | 1.4 | A | A | 5 |
| Example 4 | 890 | 750 | 115 | 108 | −6.0 | A | A | 15 |
| Example 5 | 250 | 300 | 25 | 28 | 12.0 | C | C | 2 |
| Example 6 | 300 | 380 | 50 | 45 | −2.0 | B | B | 16 |
| Comparative Example 1 | 310 | 330 | 30 | 38 | 27.0 | C | C | 35 |
| Comparative Example 2 | 120 | 145 | 3 | 8 | 166 | D | D | — |
| Comparative Example 3 | 220 | 255 | 0.5 | 2.0 | 300 | D | D | — |
| Comparative Example 4 | 180 | 310 | 0.1 | 2.5 | 2400 | D | D | — |

As can be seen from Table 2, when Examples 1 to 6 are compared to Comparative Examples 1 to 4, the results are as follows. In Comparative Example 1 in which the epoxy resin having a melt viscosity 150° C. higher than the predetermined value was used, the change rate of the viscosity of the paste A immediately after preparation and the viscosity of the paste B after long-term storage were higher than those of Examples 1 to 6. Therefore, there was no significant change in the screen printing performance between the paste immediately after preparation and the paste after long-term storage, but the change rate of the volume resistivity was high.

In addition, in Comparative Example 2 in which Ag particles were used as the conductive filler, although the epoxy resin having a melt viscosity at 150° C. of the predetermined value or lower was used, the viscosity change rate was significantly high as in Comparative Example 3, and an effect regarding the stability with time was not substantially obtained. In addition, in Comparative Examples 2 and 3 in which Ag particles were used, the viscosity of the paste was significantly lower than those of Examples 1 to 6. Therefore, sagging occurred in a printed pattern, contact between wirings was found, and the screen printing performance was evaluated as "D". Thus, the volume resistivity could not be measured. In addition, in Comparative Example 4 in which the bisphenol F type epoxy resin composition, which is liquid at room temperature, was used, the viscosity change rate was significantly high, and the effect regarding the stability with time was not substantially obtained. In addition, when a printed pattern was heated and kept at a given temperature, sagging occurred in a printed pattern, contact between wirings was found, and the screen printing performance was evaluated as "D". Thus, the volume resistivity could not be measured.

On the other hand, in the conductive pastes according to Examples 1 to 6 in which the silver-coated resin was used as the conductive filler and in which the epoxy resin that is solid at room temperature and has a melt viscosity of the predetermined value or lower at 150° C. was used at the predetermined ratio, quality deterioration in the viscosity of the paste, the screen printing performance, the conductivity, and the like was very small even after long-term storage, and the stability with time was high.

INDUSTRIAL APPLICABILITY

The conductive paste according to the present invention can be used for forming an electronic component (for example, an electrode or an electrical wiring) provided in a semiconductor element, an electronic apparatus, or an electronic display apparatus, such as a solar cell panel or a liquid crystal display.

The invention claimed is:

1. A conductive paste consisting essentially of:
a silver-coated resin; and
an organic vehicle that includes a thermosetting resin composition, a curing agent, and a solvent,
wherein the silver-coated resin is a silver-coated spherical resin having a surface coated with silver,
an aspect ratio of the silver-coated resin is 0.9 to 1.1,
the thermosetting resin composition is an epoxy resin composition which is solid at room temperature and has a melt viscosity of 0.5 Pas or lower at 150° C.,
a proportion of the silver-coated resin is 70 mass % to 90 mass % with respect to the 100 mass % of the conductive paste,
a mass ratio of a content of the thermosetting resin composition to a content of the silver-coated resin is 10:90 to 40:60,
a change rate of the viscosity of the paste at a shear rate of 100 $S^{-1}$ calculated from a following expression (1) is −6.0% to 12.0%,
wherein the change rate of the viscosity is calculated from the following expression (1);

Change Rate of Viscosity (%)={(Viscosity of Paste $B$/Viscosity of Paste $A$)−1}×100  (1), wherein, a paste A is the conductive paste immediately after preparation; a paste B is the conductive paste which is stored in a closed container after preparation under conditions of temperature: 25° C. and relative humidity: 50% for 3 months; a Viscosity of Paste A is a viscosity of the paste A at a shear rate of 100 $S^{-1}$; and a Viscosity of Paste B is a viscosity of the paste B at a shear rate of 100 $S^{-1}$.

2. The conductive paste according to claim 1,
wherein the thermosetting resin composition is one or more epoxy resin compositions selected from the group consisting of a biphenyl type, a biphenyl-containing type, a naphthalene type, a cresol novolac type, and a dicyclopentadiene type.

3. The conductive paste according to claim 1,
wherein the curing agent is an imidazole, a tertiary amine, a Lewis acid containing boron fluoride, or a compound thereof.

4. The conductive paste according to claim 1,
wherein the conductive paste is heated and cured in a temperature range of 80° C. to 300° C.

5. The conductive paste according to claim 1,
wherein the silver constituting the silver-coated resin has 18 nm to 24 nm of a crystallite diameter measured using an X-ray diffraction method.

6. The conductive paste according to claim 1,
wherein a resin material constituting the silver-coated resin having a surface coated with silver be at least one resin selected from a group consisting of acryl, phenol, polystyrene, silicone, polyamide, and polytetrafluoroethylene.

* * * * *